United States Patent
Hirano et al.

(10) Patent No.: US 9,691,434 B2
(45) Date of Patent: Jun. 27, 2017

(54) FEEDTHROUGH CONNECTOR FOR HERMETICALLY SEALED ELECTRONIC DEVICES

(71) Applicant: HGST Netherlands B.V., Amsterdam (NL)

(72) Inventors: Toshiki Hirano, San Jose, CA (US); Vipin Ayanoor Vitikkate, Palakkad-Kerala (IN)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 15/223,976

(22) Filed: Jul. 29, 2016

(65) Prior Publication Data

US 2016/0336044 A1 Nov. 17, 2016

Related U.S. Application Data

(63) Continuation of application No. 14/518,853, filed on Oct. 20, 2014, now Pat. No. 9,431,759.

(51) Int. Cl.
*G11B 25/04* (2006.01)
*G11B 33/12* (2006.01)
(Continued)

(52) U.S. Cl.
CPC ............ *G11B 33/122* (2013.01); *G06F 1/181* (2013.01); *G11B 25/043* (2013.01);
(Continued)

(58) Field of Classification Search
CPC ...... H01R 13/58; H01R 13/521; H01R 13/60; G06F 1/181; G11B 33/1446;
(Continued)

(56) References Cited

U.S. PATENT DOCUMENTS 5,282,099 A 1/1994 Kawagoe et al.
5,337,202 A 8/1994 Jabbarai et al.
(Continued)

FOREIGN PATENT DOCUMENTS

CN 101911200 12/2010
CN 102481454 5/2012
(Continued)

OTHER PUBLICATIONS

SGA Technologies, Multi Pin Feedthrough, http://www.sgatech.co.uk/glass-to-metal-seals/types-of-seal/multi-pin-feedthrough, Received Jan. 29, 2014, Retrieved Mar. 6, 2014.
(Continued)

*Primary Examiner* — Brian Miller
(74) *Attorney, Agent, or Firm* — Kunzler Law Group, PC

(57) ABSTRACT

Disclosed herein is one embodiment of an apparatus that includes a housing that defines an interior cavity. The housing also includes a spring aperture. The apparatus further includes a spring coupled to the housing over the spring aperture, with the spring having a deflection portion and a feedthrough aperture. The apparatus also has an electrical connector coupled to the spring and extending through the feedthrough aperture and the spring aperture. The electrical connector may have a plurality of electrical traces extending from a location external to the housing to a location within the interior cavity of the housing.

15 Claims, 9 Drawing Sheets

(51) Int. Cl.
    *H01R 13/58*     (2006.01)
    *G06F 1/18*     (2006.01)
    *H01R 13/60*     (2006.01)
    *H01R 13/52*     (2006.01)
    *G11B 33/14*     (2006.01)
    *H05K 5/06*     (2006.01)

(52) U.S. Cl.
    CPC ....... *G11B 33/1446* (2013.01); *H01R 13/521* (2013.01); *H01R 13/58* (2013.01); *H01R 13/60* (2013.01); *H05K 5/067* (2013.01); *H05K 5/069* (2013.01); *H01R 2201/06* (2013.01)

(58) Field of Classification Search
    CPC ..... G11B 33/122; G11B 33/08; G11B 25/043; G11B 33/022; H05K 1/118
    USPC ....................................................... 360/99.25
    See application file for complete search history.

(56) References Cited

U.S. PATENT DOCUMENTS

| | | | |
|---|---|---|---|
| 5,454,157 | A | 10/1995 | Ananth |
| 5,541,787 | A | 7/1996 | Jabbari et al. |
| 5,816,861 | A | 10/1998 | Cheng |
| 5,931,697 | A | 8/1999 | Jeong |
| 5,956,213 | A | 9/1999 | Dague et al. |
| 5,994,975 | A | 11/1999 | Allen et al. |
| 6,129,579 | A | 10/2000 | Cox |
| 6,168,459 | B1 | 1/2001 | Cox |
| 6,305,975 | B1 | 10/2001 | Steiner |
| 6,454,572 | B1 | 9/2002 | Konetski et al. |
| 6,567,235 | B2 | 5/2003 | Kasetty et al. |
| 6,594,107 | B2 | 7/2003 | Hayakawa et al. |
| 6,678,112 | B1 | 1/2004 | Kaneko |
| 6,970,322 | B2 | 11/2005 | Bernett |
| 6,989,493 | B2 | 1/2006 | Hipwell, Jr. et al. |
| 7,016,145 | B2 | 3/2006 | Gunderson et al. |
| 7,123,440 | B2 | 10/2006 | Albrecht et al. |
| 7,599,147 | B2 | 10/2009 | Gunderson |
| 7,872,836 | B2 | 1/2011 | Shindo et al. |
| 7,876,527 | B2 | 1/2011 | Nakamiya et al. |
| 8,035,923 | B2 | 10/2011 | Suzuki et al. |
| 8,059,364 | B1 | 11/2011 | Andrikowich et al. |
| 8,098,454 | B2 | 1/2012 | Kouno et al. |
| 8,179,631 | B2 | 5/2012 | Aoyagi et al. |
| 8,194,348 | B2 | 6/2012 | Jacoby et al. |
| 3,279,552 | A1 | 10/2012 | Stipe |
| 8,373,075 | B2 | 2/2013 | Munns et al. |
| 8,487,187 | B2 | 7/2013 | VandenEynden et al. |
| 8,749,914 | B2 | 6/2014 | Otake et al. |
| 9,001,458 | B1 | 4/2015 | Vitikkate et al. |
| 9,196,303 | B2 | 11/2015 | Hirano |
| 2002/0141107 | A1 | 10/2002 | Kasetty et al. |
| 2003/0022533 | A1 | 1/2003 | Joo |
| 2006/0002067 | A1 | 1/2006 | Gunderson et al. |
| 2006/0050429 | A1 | 3/2006 | Gunderson |
| 2008/0144273 | A1 | 6/2008 | Mewes et al. |
| 2008/0171465 | A1 | 7/2008 | Lauriano et al. |
| 2008/0182431 | A1 | 7/2008 | Evans |
| 2008/0259503 | A1 | 10/2008 | Aoyagi et al. |
| 2009/0034113 | A1 | 2/2009 | Hashi et al. |
| 2009/0097163 | A1 | 4/2009 | Suzuki et al. |
| 2009/0097375 | A1 | 4/2009 | Uefune et al. |
| 2009/0168233 | A1 | 7/2009 | Kouno et al. |
| 2010/0068936 | A1 | 3/2010 | Foster |
| 2010/0328815 | A1 | 12/2010 | Nakatsuka et al. |
| 2012/0182645 | A1 | 7/2012 | Kurokawa et al. |
| 2015/0098178 | A1 | 4/2015 | Otake et al. |
| 2015/0257293 | A1 | 9/2015 | Hirano et al. |
| 2015/0355685 | A1 | 12/2015 | Hirano |
| 2015/0359115 | A1 | 12/2015 | Hirano |
| 2016/0111124 | A1 | 4/2016 | Ku |

FOREIGN PATENT DOCUMENTS

| | | |
|---|---|---|
| EP | 0529345 | 3/1993 |
| JP | 06-54275 U | 7/1994 |
| JP | 2007088104 | 4/2007 |
| KR | 19931361 | 1/1993 |
| KR | 20070093450 | 9/2007 |
| KR | 20130037203 | 4/2013 |

OTHER PUBLICATIONS

Notice of Final Rejection and Decision of Refusal of the Amendment for Korean Patent Application No. KR10-2015-0031918 dated Jan. 2, 2017 with English Summary.

Office Action for Chinese Patent Application No. 201510341901.1 dated Nov. 21, 2016.

Office Action for Korean Patent Application No. 10-2015-0031918 dated Nov. 1, 2016.

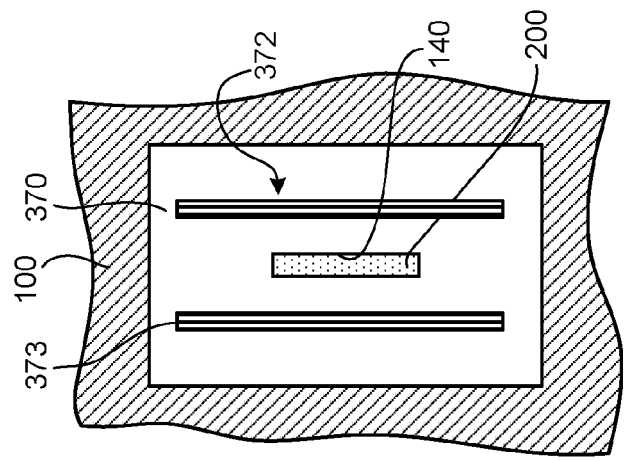
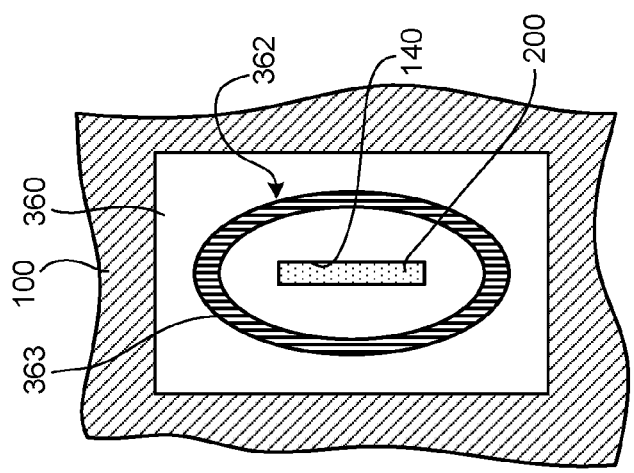
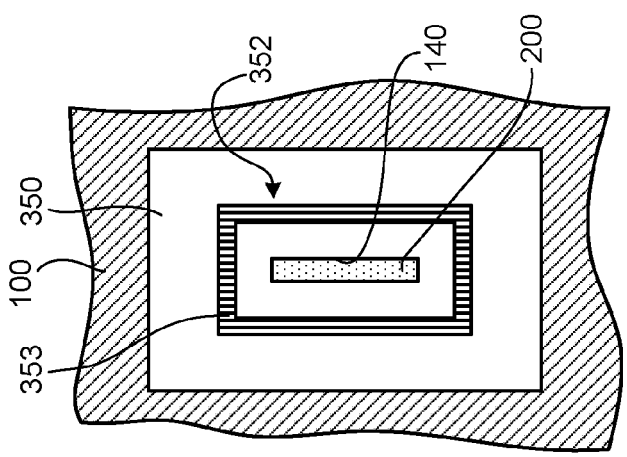

FEEDTHROUGH CONNECTOR FOR HERMETICALLY SEALED ELECTRONIC DEVICES

FIELD

This disclosure relates generally to electrical connectors for electronic devices, and more particularly to feedthrough electrical connectors for hermetically sealed electronic devices.

BACKGROUND

Hard disk drives are commonly used for storing and retrieving digital information using rapidly rotating discs or platters coated with magnetic material. Digital information is transferred between a hard disk drive and a computing device by virtue of an electrical connector forming part of the hard disk drive. Conventional electrical connectors include non-feedthrough connectors (e.g., P2 connectors) and feedthrough connectors.

Feedthrough connectors are defined by a plurality of electrical connections extending from outside the housing of an electronic device, such as a hard disk drive, to within an interior cavity of the electronic device. The portion of the electrical connections external to the housing are electrically coupled to a mating electrical connector of a computing device, while the portion of the electrical connections internal to the housing are electrically coupled to various components within the interior cavity.

Conventional feedthrough connectors are often difficult to couple to the housing of an electronic device, especially in circumstances where the interior cavity of the housing is sealed and maintained at a certain condition (e.g., pressure, temperature, air composition, etc.). For example, certain hard disk drives greatly benefit from a housing that isolates the interior cavity and the contents of the hard disk drive from the atmosphere exterior to the housing.

Further, conventional feedthrough connectors often experience severe and repeated mechanical stress caused by thermal cycling of the feedthrough connectors. In other words, different materials often utilized in forming and sealing the feedthrough connector within a feedthrough aperture of a hermetically sealed chamber have different coefficients of thermal expansion. Such non-uniformity of thermal expansion between components may impart mechanical stress and strain to the components, especially at the joints between components of the feedthrough connector assembly. Mechanical stress and strain can cause cracks and/or fractures to form in the feedthrough connector assembly, which may jeopardize the integrity of the hermetically sealed environment.

Some conventional solutions involve utilizing materials that have similar coefficients of thermal expansion, which may decrease the mechanical stress and strain caused by repeated thermal cycling. However, the manufacturing processes associated with the use of materials with matching coefficients of thermal expansion tend to significantly increase the cost of manufacturing and materials.

SUMMARY

The subject matter of the present application has been developed in response to the present state of the art, and in particular, in response to the problems and needs associated with hard disk drives and associated electrical connectors that have not yet been fully solved by currently available systems. Accordingly, the subject matter of the present application has been developed to provide a feedthrough electrical connector, and associated apparatus, systems, and methods, that overcomes at least some of the above-discussed shortcomings of the prior art.

Disclosed herein is one embodiment of an apparatus that includes a housing that defines an interior cavity. The housing also includes a spring aperture. The apparatus further includes a spring coupled to the housing over the spring aperture, with the spring having a deflection portion and a feedthrough aperture. The apparatus has an electrical connector coupled to the spring and extending through the feedthrough aperture and the spring aperture. The electrical connector may have a plurality of electrical traces extending from a location external to the housing to a location within the interior cavity of the housing.

According to one implementation, the electrical connector is exclusively indirectly coupled to the housing via the spring. According to another implementation, the apparatus further includes at least one support bracket coupled to the housing, with the at least one support bracket being in supporting engagement with the electrical connector. The electrical connector may be exclusively indirectly coupled to the housing via the spring and the at least one support bracket. According to another implementation, the deflection portion of the spring absorbs thermal expansion of the electrical connector. In one implementation, the deflection portion extends entirely around the feedthrough aperture. The deflection portion may form a rectangular footprint or an ovular footprint, among other shapes, or the deflection portion may include multiple deflection portions. In another implementation, the spring may be directly coupled to an external surface of the housing and/or a sidewall of the spring aperture of the housing. In one implementation, a seal between the spring and the housing maintains the interior cavity as a hermetically sealed environment. For example, the interior cavity may contain a helium-enriched environment and the seal may include one or more of solder, adhesive, and epoxy, with the epoxy having a low helium permeability.

Disclosed herein is another embodiment of an apparatus that includes a housing that defines an interior cavity. The housing also includes a spring aperture. The apparatus further includes a spring coupled to the housing over the spring aperture, with the spring having a deflection portion and a feedthrough aperture. The apparatus further includes an electrical connector coupled to the spring and extending through the feedthrough aperture and the spring aperture. The electrical connector has a plurality of electrical traces extending from a location external to the housing to a location within the interior cavity of the housing. The electrical connector further includes an electrically insulating base that has multiple layers of electrically insulating material with the plurality of electrical traces extending between the multiple layers. The electrically insulating base includes an inwardly positioned portion disposed in the interior cavity, an outwardly positioned portion disposed external to the interior cavity, and a sealing portion disposed between the inwardly positioned portion and the outwardly positioned portion, with the sealing portion being sealed to the feedthrough aperture of the spring. The electrical connector further includes a first plurality of electrical leads disposed on the outwardly positioned portion of the electrically insulating base and a second plurality of electrical leads disposed on the inwardly positioned portion of the electrically insulating base. Each electrical lead of the first plurality of electrical leads is electrically coupled to a respective electrical lead of the second plurality of electrical leads via the electrical traces.

According to one implementation, the electrical connector is exclusively indirectly coupled to the housing via the spring. In another implementation, the apparatus further includes at least one support bracket coupled to the housing, with the at least one support bracket being in supporting engagement with the electrical connector. The electrical connector may be exclusively indirectly coupled to the housing via the spring and the at least one support bracket. The deflection portion of the spring may absorb the thermal expansion of the electrical connector.

Further disclosed herein is one embodiment of a hard disk drive that includes a hermetically sealed housing that substantially isolates a hard drive cavity containing a helium enriched environment from an exterior atmosphere, with the housing having a spring aperture. The hard disk drive further includes a spring coupled to the hermetically sealed housing over the spring aperture and the spring has a deflection portion and a feedthrough aperture.

The hard disk drive may further include an electrical connector coupled to the spring and extending through the feedthrough aperture and the spring aperture. The electrical connector has a plurality of electrical traces extending from a location external to the hermetically sealed housing to a location within the interior cavity of the hermetically sealed housing. The electrical connector may include an electrically insulating base that has multiple layers of electrically insulating material with the plurality of electrical traces extending between the multiple layers. The electrically insulating base includes an inwardly positioned portion disposed in the interior cavity, an outwardly positioned portion disposed external to the interior cavity, and a sealing portion disposed between the inwardly positioned portion and the outwardly positioned portion, with the sealing portion being sealed to the feedthrough aperture of the spring. Further, the electrical connection includes a first plurality of electrical leads disposed on the outwardly positioned portion of the electrically insulating base and a second plurality of electrical leads disposed on the inwardly positioned portion of the electrically insulating base, with each electrical lead of the first plurality of electrical leads being electrically coupled to a respective electrical lead of the second plurality of electrical leads via the electrical traces.

The hard disk drive may further include at least one support bracket coupled to the hermetically sealed housing. The at least one support bracket is in supporting engagement with the electrical connector and the electrical connector is exclusively indirectly coupled to the hermetically sealed housing via the spring and the at least one support bracket.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which:

FIGS. 3A-3C are top partial views of a feedthrough electrical connector extending through a hermetically sealed chamber housing showing various embodiments of spring footprints of springs coupled to the housing;

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1:
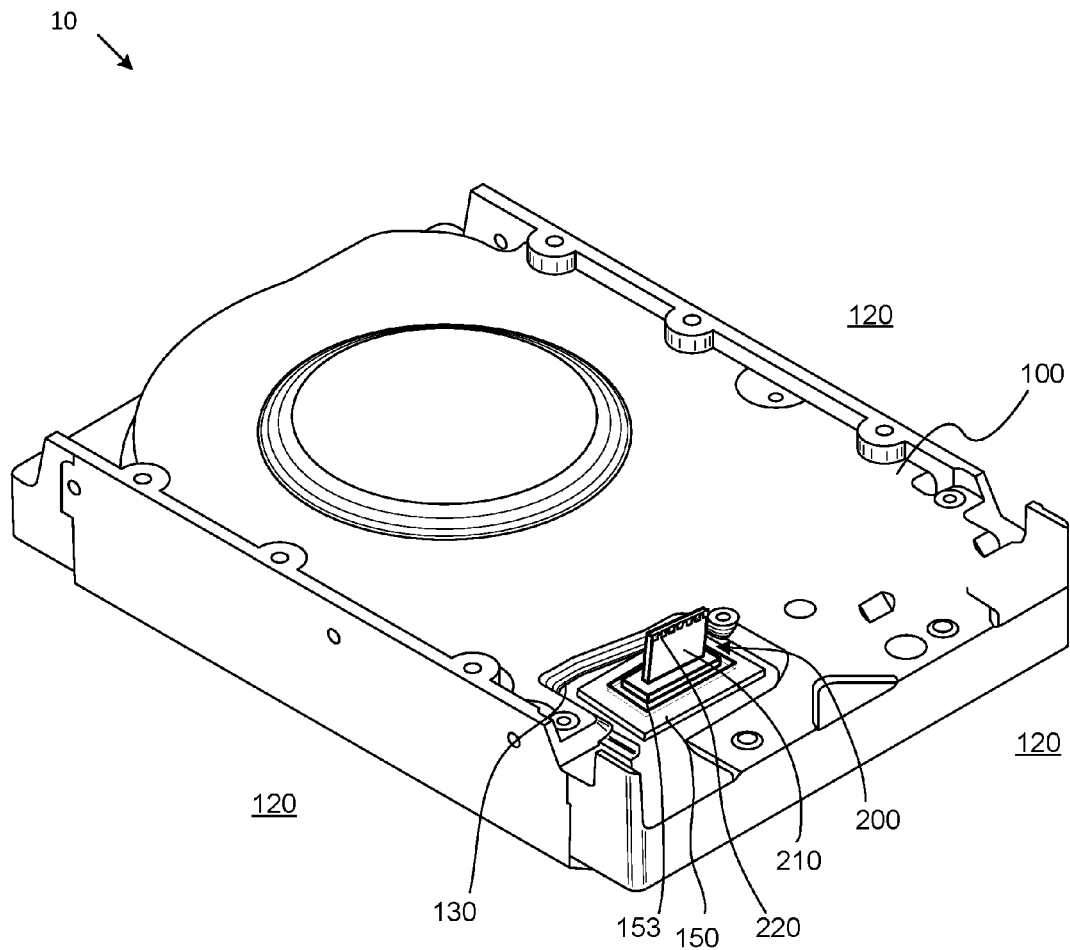
FIG. 1 is a perspective view of a hard disk drive with a feedthrough electrical connector coupled to a spring, according to one embodiment.
Figure 2:
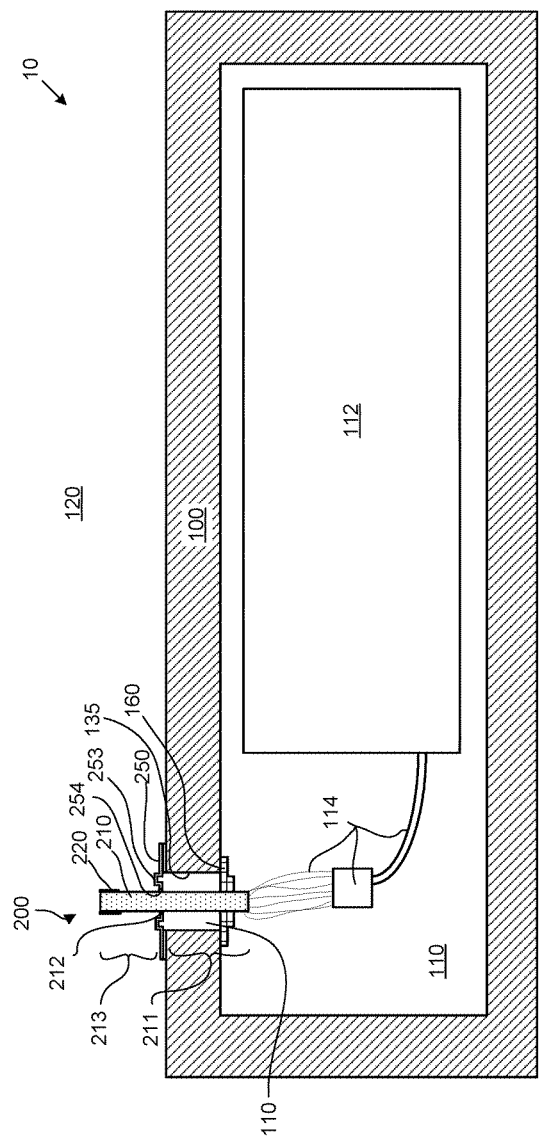
FIG. 2 is a cross-sectional side view of a hard disk with a feedthrough electrical connector coupled to a spring, according to one embodiment.

Referring to FIGS. 1 and 2, a hard disk drive 10 with a feedthrough electrical connector 200 and a spring 150 is shown according to one embodiment. The hard disk drive 10 includes a housing 100 that defines an interior cavity 110. The interior cavity 110 contains hard disks and other interior components 112 of the hard disk drive 10. In one embodiment, the feedthrough electrical connector 200 includes an electrically insulating base 210 with a plurality of electrical leads 220 disposed on at least one peripheral surface of the electrically insulating base 210 and a plurality of corresponding electrical traces (not shown) extending through the electrically insulating base. In another embodiment, the electrical connector includes a plurality of pins (traces) extending through the electrically insulating base and a skirt positioned about a periphery of the electrically insulating base. Generally, the feedthrough electrical connector 200 electrically connects the interior components 112 of the hard disk drive with a computing device (not shown), while still maintaining the interior cavity 110 of the hard disk drive relatively isolated from the exterior atmosphere 120. Additional details relating to the feedthrough electrical connector 200 are included below with reference to FIGS. 2-7.

Although the illustrated embodiments described below are in relation to a hard disk drive with an electrical connector, in other embodiments, the principles and features of the present disclosure can be applied to other electronic devices that could benefit from a feedthrough electrical connector, such as solid state memory devices, semiconductor devices, general computing devices, and the like.

The housing 100 of the hard disk drive 10 houses and protects the various internal components 112 configured to store and retrieve data and information, as well as to control the storage and retrieval of data and information. The components 112 within the interior cavity 110 may include magnetic recording media (e.g., disks), read/write heads, actuators (e.g., swings arms), electrical circuitry, and the like. The hard disk drive 10 can be in electrical communication with a computing device (not shown) to transfer data for operation of the computing device. In one embodiment, the housing 100 is configured to hermetically seal the components 112 of the hard disk drive 10 from the exterior environment 120. In certain implementations, the housing 100 includes two or more sections coupled together to maintain the sealing nature of the housing. According to some implementations, the housing 100 maintains the interior cavity 110 of the housing of the hard disk drive 10 at a pressure below atmospheric pressure. Because the components of hard disk drives, according to one embodiment, are sensitive to contaminants and pressure changes, hermetically sealing the internal components 112 of the hard disk drive 10 from the exterior environment 120 promotes the proper operation of the hard disk drive 10 and also extends the life of the hard disk drive 10.

The housing 100, which can be made from any of various materials (such as hardened plastics, metal, and the like), may, in certain embodiments, include a connector receptacle 130. The connector receptacle 130 is formed in an exterior surface of the housing 100 about a spring aperture 135 (see FIG. 2), which is also formed in the housing 100. The spring aperture 135, in the absence of the spring 150 and the feedthrough electrical connector 200, is open to the interior cavity 110 of the hard disk drive 10. Generally, the connector receptacle 130 may be configured to receive and orient mating electrical connectors that are connectable with the electrical connector 200. Although shown in FIG. 1 as a tray or indentation in the housing 100 that is substantially larger than the connector 200 and larger than the spring 150, in other embodiments, the connector receptacle 130 may be sized similar to the electrical connector 200 in order to physically support the spring 150 or the protruding surfaces of the electrical connector 200. Further, the connector receptacle 130 may be useful for retaining a layer of solder, adhesive, or other weldment agent for securing the spring 150 to the housing 100. Further details regarding the spring 150 and the electrical connector 200 are included below.

FIG. 2 is a schematic cross-sectional side view of a hard disk drive 10 with the feedthrough electrical connector 200 and the spring 250, according to one embodiment. In the depicted embodiment, the hard disk drive 10 includes a housing 100 that substantially isolates the interior cavity 110 of the hard disk drive 10 from the exterior atmosphere 120. For example, the interior cavity 110 may have a helium enriched atmosphere or the interior cavity 110 may be maintained at a lower pressure than the pressure of the exterior atmosphere 120. Certain hard disk drives 10 are specifically configured to have or maintain certain conditions within the interior cavity 110 to promote the efficient operation of the hard disk drive 10. Leaks from the housing tend to disrupt the desired conditions within the interior cavity (e.g., cause an increase in pressure or introduction of heavier air), which can harm the efficiency and reliability of the hard disk drive 10.

The embodiment of the housing 100 depicted in FIG. 2 does not include a connector receptacle 130 (as depicted in FIG. 1). The housing 100 holds the components 112 of the hard disk drive, such as magnetic media and read/write arms. Also depicted schematically in the interior cavity 110 of the hard disk drive 10 are secondary electrical connections 114 that electrically connect the components 112 of the hard disk drive 10 to the feedthrough electrical connector 200. The secondary electrical connections 114 may be wiring, electrical traces, connectors, controllers, control modules, and the like. Such secondary electrical connections 114 may be configured to connect with the feedthrough electrical connector 200 in a variety of ways, as recognized by those of ordinary skill in the art.

The spring 250, which may be constructed of a metallic material, a plastic material, a polymeric material, or a composite material, among others, is coupled to the housing 100 and extends over and at least partially across the spring aperture 135. The spring aperture 135 is an aperture formed in the wall of the housing 100 that is wider than the cross-sectional dimensions of the electrical connector 200. The spring 250 may be directly coupled to the housing via any of various coupling techniques, such as techniques using solder, adhesive, or epoxy, among others. Additional details relating to the spring 250 are included below with reference to FIGS. 3A-4F. Generally, the spring 250 includes a feedthrough aperture 254 through which the electrical connector 200 extends and to which the electrical connector 250 is directly coupled. The coupling of the spring 250 to the housing 100 (across the spring aperture 135) and the coupling of the electrical connector 200 within the feedthrough aperture 254 creates a hermetic seal that isolates the interior cavity 110 from the exterior atmosphere 120. In other words, in one embodiment the electrical connector 200 is indirectly coupled to the housing 100 via the spring 250. In such an embodiment, direct engagement or contact between the electrical connector 200 and the housing, if any, is not contributing to the hermetic seal.

The spring 250 includes a deflection portion 253 that helps to absorb thermal expansion of the electrical connector 200 relative to the housing 100 caused by thermal cycling (i.e., operation of the feedthrough connector). The deflection portion 253, according to one embodiment, is a bend, curve, twist, or bow in the spring. As will be described in greater detail below with reference to FIGS. 3A-4F, the deflection portion 253 compresses and expands as the electrical connector 200 thermally expands and compresses, respectively. In other words, the deflection portion 253 dampens and/or dissipates thermal or other expansion of the electrical connector 200, thus helping to maintain the hermetic seal.

Figure 7:
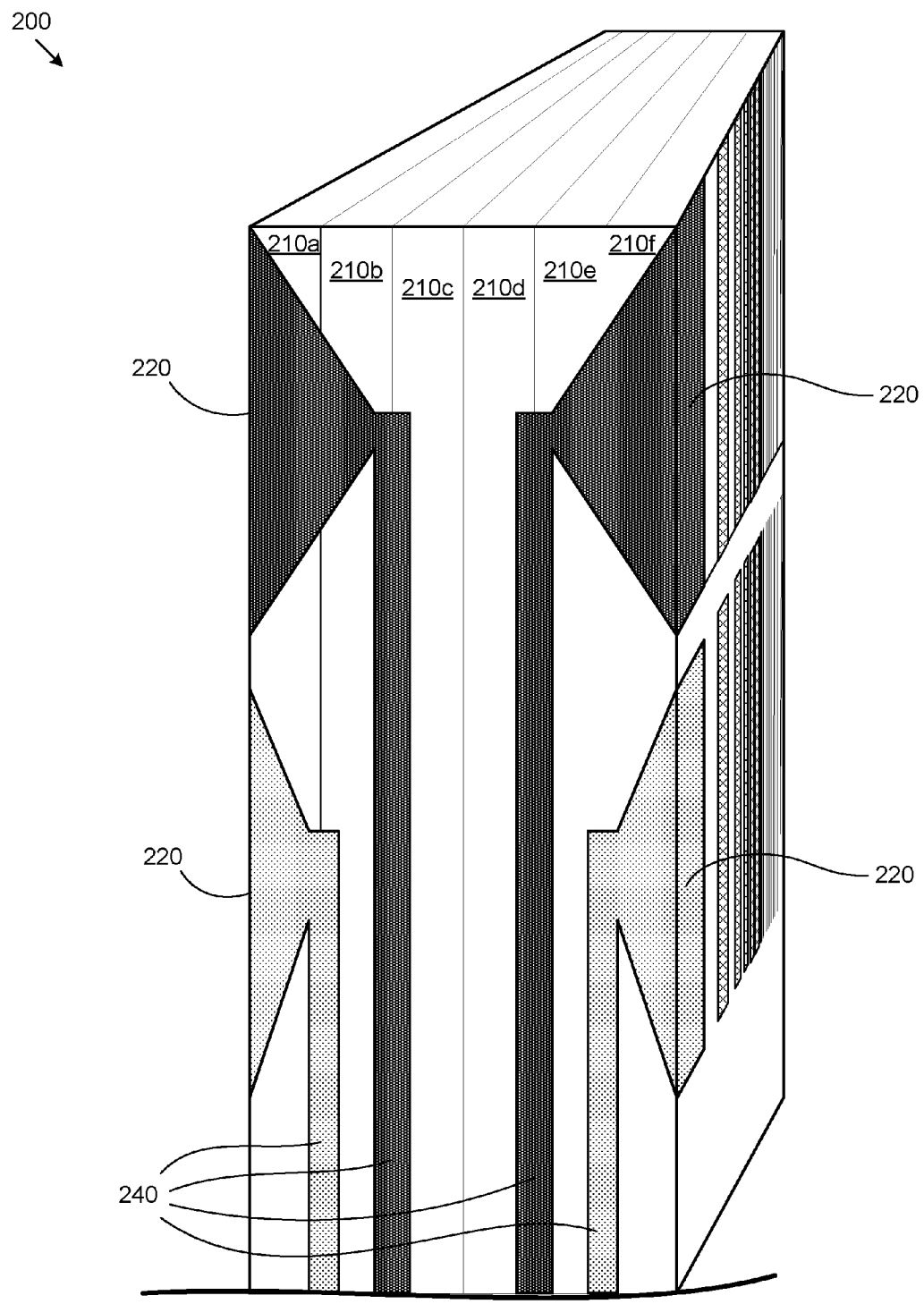
FIG. 7 is a magnified cross-sectional perspective view of a feedthrough electrical connector according to one embodiment.

According to one embodiment, the feedthrough electrical connector 200 includes an electrically insulating base 210 and a plurality of electrical leads 220. The electrically insulating base 210 may include multiple layers of electrically insulating material with electrical traces extending between adjacent layers. For example, the multiple layers may extend in a direction perpendicular to the cross-sectional area of the feedthrough aperture 254. The electrically insulating base 210 also includes three different portions or sections: an inwardly positioned portion 211, a sealing portion 212, and an outwardly positioned portion 213. Although described and referenced throughout the disclosure as three separate portions 211, 212, 213, it is contemplated that, according to one embodiment, the electrically insulating base 210 may be a single, integrated structure. In other embodiments, the electrically insulating base 210 may be modular such that each portion 211, 212, 213 is a separate material. Further, in one embodiment, the electrically insulating base 210 may be layered (FIG. 7). Additional details regarding the structure and composition of the electrically insulating base 210 are included below with reference to FIGS. 5A and 7.

In one embodiment, the feedthrough electrical connector 200 has at least a first plurality of electrical leads 220 on the outwardly positioned portion 213. The first plurality of electrical leads 220 may be disposed on at least one peripheral surface of the outwardly positioned portion 213. The arrangement, material, and structure of the leads 220 are described in greater detail below with reference to FIG. 5A-7. The first plurality of electrical leads 220 are electrically connected, via electrical traces/wires not depicted in FIG. 2, to corresponding contact points on the inwardly positioned portion 211 of the electrically insulated base material 210 for connecting with the components 112 of the hard disk drive 10.

Although described in greater detail below, the inwardly positioned portion 211 of the electrically insulating base 210 of the feedthrough electrical connector 200 may or may not have similarly situated electrical leads. For example, in one embodiment, the secondary electrical connections 114 may electrically connect to the electrical connector 200 via leads disposed on the inwardly positioned portion 211 of the electrically insulating base 210. However, in another embodiment, the inwardly positioned portion of the electrically insulating base 210 may resemble a conventional electrical connector that has electrical contact points for interfacing with the integrated wiring 114 and components 112 of the hard disk drive 10.

The sealing portion 212 is the portion/region of the feedthrough electrical connector 200 that engages the feedthrough aperture 254 and couples the connector 200 to the spring 250. In one embodiment, the sealing portion 212 is electroplated with a soldering metal or other weldment facilitator for coupling the connector 200 to the spring 250. In another embodiment, the sealing portion 212 couples to the feedthrough aperture 254 via an adhesive composition. Additional details relating to the sealing portion 212 are included below with reference to FIG. 5A.

In one embodiment, the feedthrough electrical connector 200 has a first plurality of electrical leads 220 disposed on a distal end of the outwardly positioned portion 213 of the electrically insulating base 210. These leads 220 are configured to be inserted into a corresponding/mated receptacle. For example, the outwardly positioned portion 213 of the connector 200 may be a zero-insertion-force type of connector. In another embodiment, the feedthrough electrical connector 200 may have a first plurality of electrical leads 220 disposed on a distal end of the outwardly positioned portion of the electrically insulating base 210.

FIGS. 3A-3C are top partial views of the feedthrough electrical connector 200 extending through the hermetically sealed chamber housing 100 showing various embodiments of spring footprints of springs coupled to the housing 100. As described above, the spring extends across the spring aperture 135 in the housing 100. Also as described above, the spring includes a deflection portion that facilitates absorbing thermal expansion of the electrical connector 200 caused by thermal cycling and thermal fluctuations. As described below with reference to FIGS. 4A-4F, the deflection portion may have the form of an outwardly and/or inwardly oriented bend, bow, trench, or curve.

FIG. 3A shows a spring 350 that includes a deflection portion 353 that has a rectangular spring footprint 352. The term spring footprint is defined herein as the pattern of the deflection portion across the surface of the spring. In other words, the term spring footprint refers to the relative configuration and orientation of the deflection portion with respect to the feedthrough aperture (or electrical connector). As depicted in FIG. 3A, the deflection portion 353 extends 360 degrees around the electrical connector 200 in a rectangular pattern. FIG. 3B shows a spring 360 with a deflection portion 363 that extends completely around the electrical connector 200 in an ovular (e.g., circular, elliptical, etc.) spring footprint 362. FIG. 3C shows yet another embodiment where the spring 370 includes a deflection portion 373 that does not extend completely around (i.e., does not completely circumscribe) the electrical connector 200. The deflection portion 373 may extend in straight lines, for example, along two sides of the electrical connector 200. In one embodiment, the deflection portion 373 extends along the two wider sides of the electrical connector 200 to absorb the out-of-plane thermal expansion of the electrical connector 200.

While the outer periphery of each of the springs 350, 360, 370 depicted in FIGS. 3A-3C is rectangular, it is expected that the outer peripheries of the springs may have other shapes, according to the specifics of a given application. For example, the outer periphery of a spring may form a square shape or a circular shape.

Figure 4A:
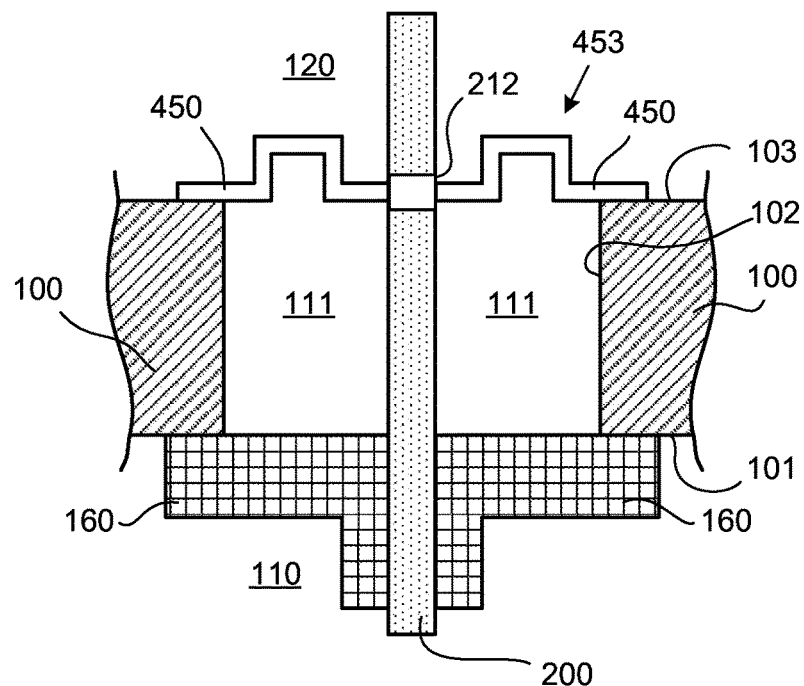
FIGS. 4A-4F are partial cross-sectional side views of a feedthrough electrical connector extending through a hermetically sealed chamber housing showing various embodiments of deflection portions of springs coupled to the housing.

FIGS. 4A-4F are partial cross-sectional side views of the electrical connector 200 extending through the hermetically sealed chamber housing 100 showing various embodiments of deflection portions of springs coupled to the housing 100. FIG. 4A shows one embodiment of a spring 450 that is coupled to a sealing portion 212 of the connector 200. The sealing portion 212 is described in more detail below with reference to FIGS. 5A-B and 6A-B. The spring is also coupled to an outer surface 103 of the housing 100 and has a deflection portion 453 with a rectangular rib profile. The deflection portion 453 protrudes outwardly away from the space 111 of the spring aperture and is able to facilitate absorbing the mechanical/structural stress imparted to the apparatus by the thermal expansion of the electrical connector 200. As described above, the spring 450 may be coupled to the housing via soldering, weldment, epoxy, or adhesive, among others, in order to form a hermetic seal.

Figure 4B:
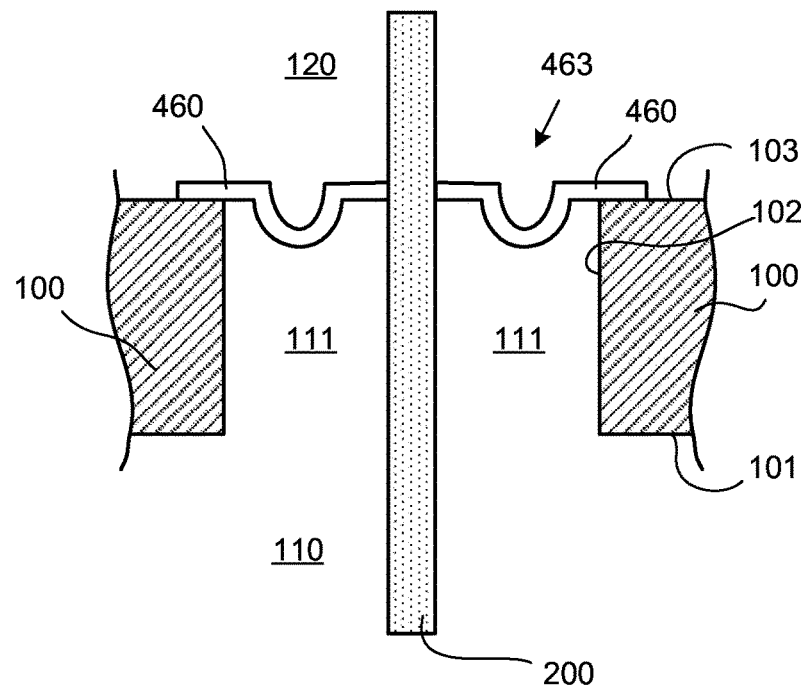

Also depicted in FIG. 4A is a support bracket 160 coupled to the inner surface 101 of the housing. However, the support bracket 160, according to one embodiment, does not provide a sealing engagement with the electrical connector 200 and thus does not contribute to the hermetic seal of the housing. In other words, the internal atmosphere of the interior cavity 110 may extend beyond the support bracket 160 and into the space 111 of the spring aperture, as shown in FIGS. 4A-4F. Accordingly, the support bracket 160 may be coupled to the housing 100 via fasteners and/or adhesives, among others. The support bracket 160 may be optionally included to provide mechanical reinforcement to the feedthrough connection. In one embodiment, as depicted in FIG. 4B, the feedthrough connector and the spring are implemented without a support bracket. While the spring 450 dampens the micro movement/vibration of thermal expansion, the support bracket 160 may be used to provide macro reinforcement. In other words, the support bracket 160 may be in non-sealing (e.g., supportive) engagement with the electrical connector 200. The shape, size, orientation, and configuration of the support bracket 160 may be different than depicted in the figures of the present disclosure. Additionally, the support bracket 160 may also have electrical traces/leads and may be utilized to make electrical connections with other components.

Figure 4C:
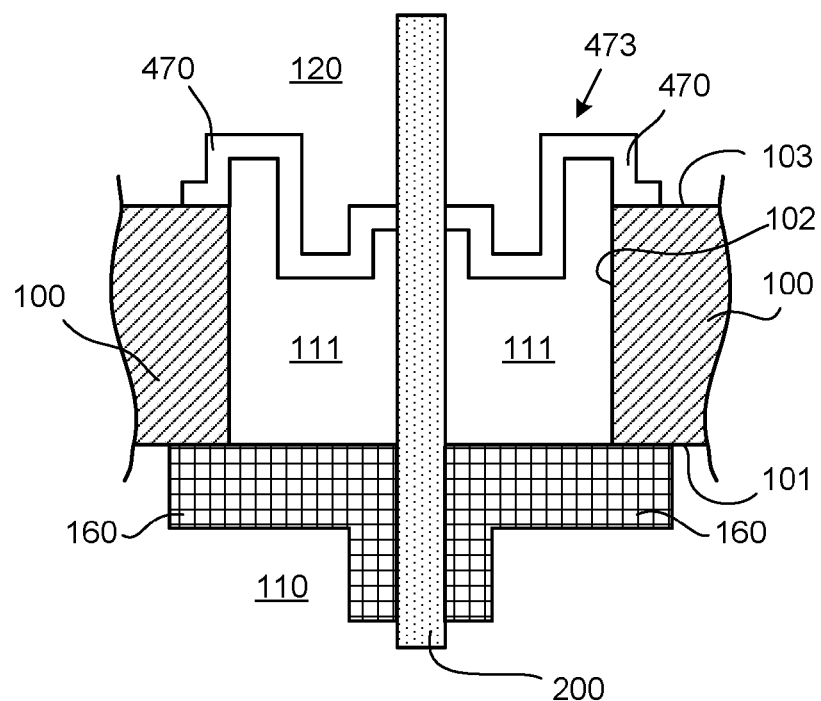
Figure 4D:
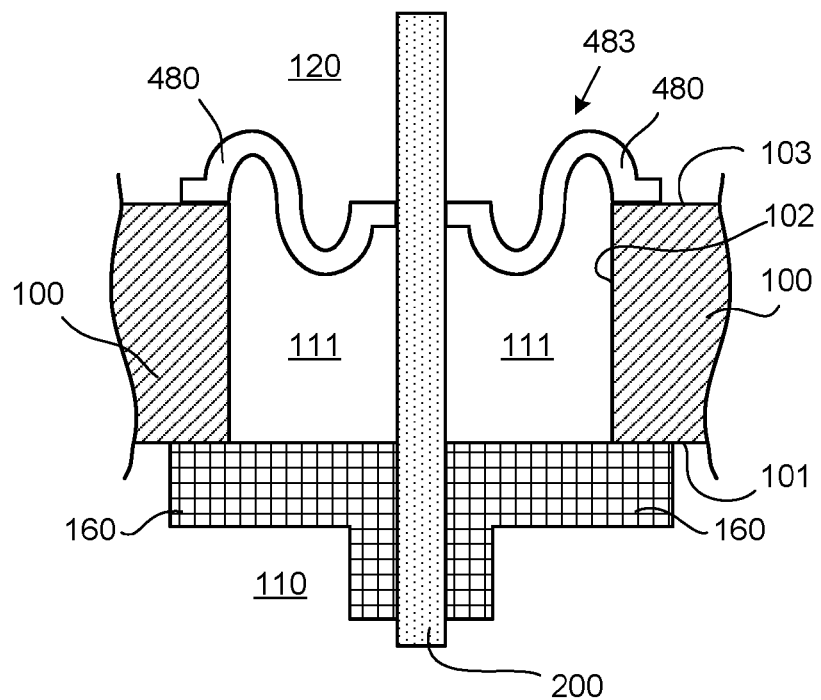

FIG. 4B depicts a similar embodiment, only the spring 460 includes a deflection portion 463 that has a circular trench profile that indents inwardly. FIG. 4C shows a deflection portion 473 with a rectangular, wave-like trough profile. The deflection portion 473 of FIG. 4C may be considered a single deflection portion with two troughs facing in opposite directions. In another embodiment, the deflection portion 473 may consist of two separate, spaced apart deflection portions. In another embodiment, the spring may have multiple deflection portions spaced apart across the surface of the spring. FIG. 4D shows a deflection portion 483 with a circular, wave-like, trough profile.

Figure 4E:
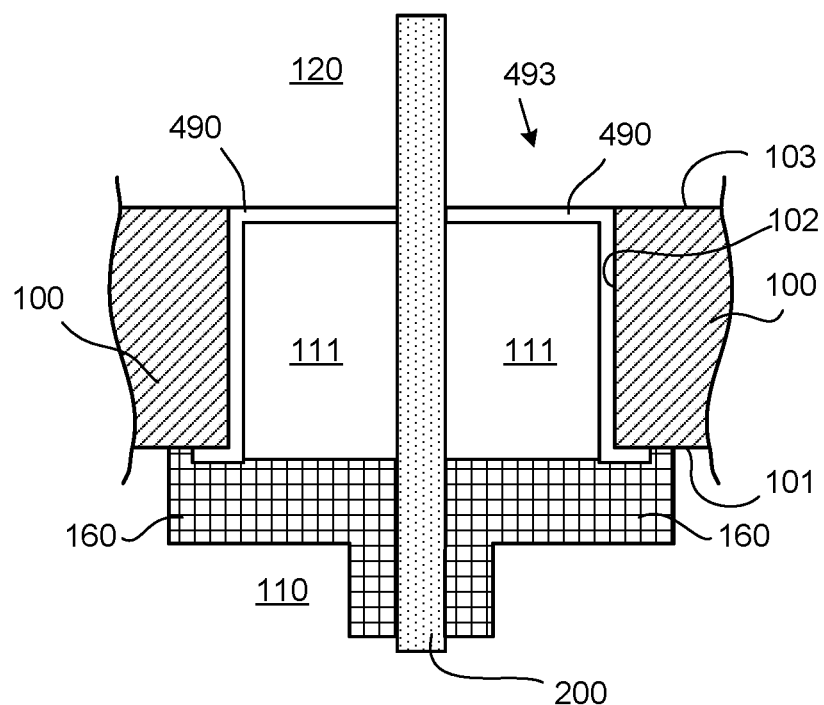
Figure 4F:
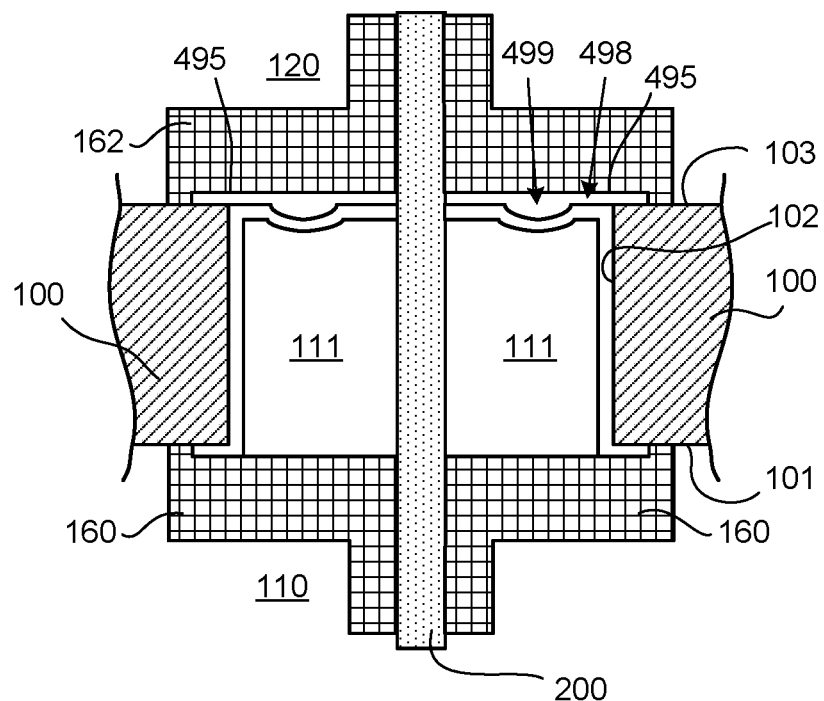

FIG. 4E depicts a spring 490 that is directly coupled to the sidewalls 102 of the spring aperture of the housing 100. The spring 490 also includes a lip that extends to engage the inner surface 101 of the housing 100. The spring 490 depicted in FIG. 4E does not have a deflection portion formed in a portion of the spring 490 but instead the entire spring 490 effectively forms a large deflection portion 493. FIG. 4F depicts an embodiment similar to FIG. 4E, but the spring 495 in FIG. 4F also includes an indentation that forms a deflection portion 499. Also depicted in FIG. 4F is a second support bracket 162. Similar to the support bracket 160 described above, the second support bracket 162 may provide additional supporting engagement to the electrical connector 200 and/or may include electrical contacts/traces for facilitating electrical connections with other electrical components. It is expected that the spring may be implemented in other manners not explicitly described herein and/or may be implemented by combining various aspects of the several embodiments described herein.

Figure 5A:
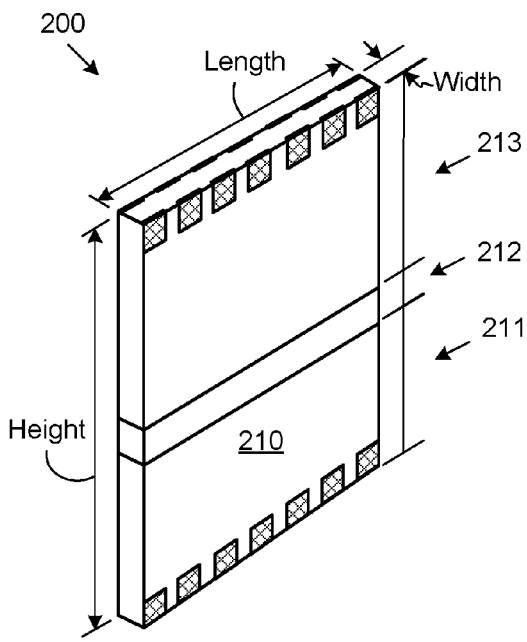
FIG. 5A is a perspective view of a feedthrough electrical connector according to one embodiment.

FIG. 5A is a perspective view of a feedthrough electrical connector 200 according to one embodiment. As described above, the feedthrough electrical connector 200 has an electrically insulating base 210 that defines the structure and overall shape of the connector 200. The electrically insulating base 210 may be any non-conductive material that is suited for use in an electrical device. For example, the electrically insulating base 210 may be glass, ceramic, rubber, plastic, polymer, and the like. In one embodiment, the electrically insulating base 210 may be constructed in the same manner as printed circuit boards, printed wiring boards, etched wiring boards, printed circuit board assemblies, or circuit card assemblies. Although described in greater detail below with reference to FIG. 7, the electrically insulating base 210 includes electrical traces for conveying electric current and electrical signals between the first plurality of electrical leads 220 and the second plurality of electrical leads 230. In one embodiment, the electrically insulating base 210 implemented in the connector 200 may be selected according to the specific material's ability to withstand the conditions present in the interior cavity 110 of the hard disk drive 10. For example, if a helium enriched atmosphere is maintained in the interior cavity 110, an electrically insulating base 210 may be selected that has low helium permeability, thus promoting the isolation of the helium enriched interior cavity 110 from the exterior atmosphere 120.

The three portions 211, 212, 213 of the electrically insulating base 210 are also depicted in FIG. 5A. As described above, the three portions 211, 212, 213 may be a single, integrated structure. In other embodiments, the electrically insulating base 210 may be modular such that each portion 211, 212, 213 is a separate material. In one embodiment, the portions 211, 212, 213, may not be definitively marked and the portions may not be visually or structurally distinguishable from each other. In other words, the present disclosure distinguishes the portions 211, 212, 213 generally based on the expected arrangement and use of the feedthrough electrical connector 200. For example, the outwardly positioned portion 213 may be comparatively more rigid and may be constructed of a stronger non-conductive material so as to withstand the conditions of the exterior atmosphere and/or repeated connecting and disconnecting (depending on the specifics of a given application). Also, the comparative lengths and relative dimensions of the three portions 211, 212, 213 are only illustrative of one embodiment and are not intended to restrict the scope of the disclosure. In other words, one portion may be substantially larger, longer, and/or wider than another portion, depending on the specifics of a given application. Also, as described below, the number, size, configuration, and arrangement of the depicted electrical leads 220, 230 are not restrictive of the scope of the present disclosure. In one embodiment (as depicted) the width of electrically insulating base 210 is substantially smaller than the length and the height of the electrically insulating base 210.

The sealing portion 212 may simply be a medial region where the connector 200 is coupled to the spring. However, in another embodiment the external surfaces of the sealing portion 212 may be electroplated with a soldering material. In another embodiment, the sealing portion 212 may include a prepared surface that is capable of bonding, through the use of an adhesive or epoxy, to the feedthrough aperture. In yet another embodiment, both and adhesive and solder (or other weldment agent) may be implemented to seal the connector 200 within the feedthrough aperture of the spring, thus substantially maintaining the interior cavity 110 isolated from the exterior atmosphere 120. For example, in one embodiment, electroplating material may be disposed along the length of the sealing portion 212 and an adhesive may be disposed along the width of the sealing portion 212. As briefly described above, the sealing portion 212 may not only be the region of the connector 200 that is directly engaged with the feedthrough aperture. In one embodiment, the sealing portion 212 may extend beyond the thickness of the feedthrough aperture of the spring. Once again, the adhesive and/or the solder may be selected according to its ability to withstand the expected conditions within the interior cavity 110 or the exterior atmosphere 120 (e.g., low helium permeability).

The electrically insulating base 210 may have a cross-sectional area, at least at the sealing portion, that is less than about 200 square millimeters. In a further embodiment, the cross-sectional area of the electrical connector may be less than about 100 square millimeters. In one embodiment, the electrical connector, at least in the sealing portion, has a cross-section that is co-planar with the cross-sectional area of the feedthrough aperture and that includes a first and second dimension. The first dimension, according to one embodiment, is substantially longer than the second direction. For example, the first dimension may be at least 5 times the length of the second dimension. In another implementation, the first dimension is at least 10 times the length of the second dimension.

Figure 5B:
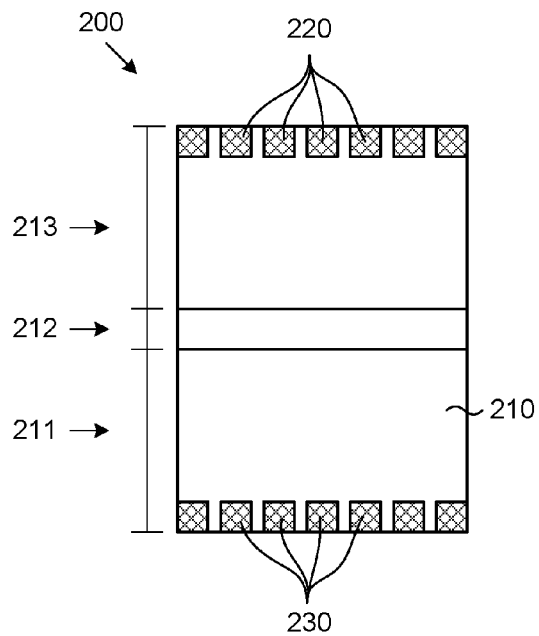
FIG. 5B is a front view of the feedthrough electrical connector of FIG. 5A.

FIG. 5B is a front view of the feedthrough electrical connector 200 of FIG. 5A, according to one embodiment. As described and shown in FIGS. 3 and 4, the electrical connector 200 has a first plurality of leads 220 disposed on the outwardly positioned portion 213 and a second plurality of leads 230 disposed on the inwardly positioned portion 211. The first 220 and second plurality of leads 230 are interconnected via traces/wiring extending the length of the electrically insulating base 210 (see FIG. 7). As described above, the first plurality of electrical leads 220 are disposed on at least one peripheral surface of the outwardly positioned portion 213 of the connector 200. However, the second plurality of electrical leads 230, while they may be similar in arrangement and configuration to the first plurality of electrical leads 220 (as depicted in FIGS. 4 and 5A-5C), in another embodiment may have the structure and configuration of a conventional electrical connector (i.e., electrical terminals, electrical contacts, wire couplings, etc.).

The leads 220, 230 may be constructed from any electrically conductive material that is suited for use in an electrical device. For example, the electrical leads 220, 230 may be constructed of metals such as copper, aluminum, gold, zinc, nickel, brass, bronze, iron, platinum, etc. In another embodiment, the electrical leads 220, 230 may be constructed of other conductive materials, such as graphite and conductive polymers. The number of leads in the first plurality of electrical leads 220 is not limited to the number depicted in the Figures. In one embodiment, the feedthrough electrical connector 200 may less than 20 associated electrical leads. However, in another embodiment the feedthrough electrical connector 200 may have more than 20 associated electrical leads (i.e., hundreds or thousands) depending on the specifics of a given application.

Figure 5C:
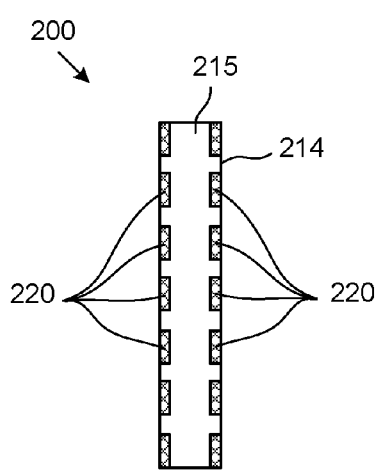
FIG. 5C is a top view of the feedthrough electrical connector of FIG. 5A.

FIG. 5C is a top view of the feedthrough electrical connector 200 of FIG. 5A, according to one embodiment. As depicted, the first plurality of electrical leads 220 may be disposed on opposing lateral peripheral sides 214 of the outwardly positioned portion 213 of the electrically insulating base 210. Additionally, the electrical leads 220, or at least a portion of the electrical leads 220, may be exposed on the leading edge 215 of the connector 200, thus allowing a mating connector to electrically engage the leads 220 on the peripheral sides 214 and/or the leading edge/surface 215 of the feedthrough connector 200. Also, the first plurality of electrical leads 220 may be disposed on all the lateral sides 214 of the feedthrough connector 200 instead of just two opposing sides. In another embodiment, the leads 220 may only be disposed on a single side. Further details and embodiments relating to the shape of the connector 200 and the arrangement of the leads 220 are included below.

Figure 6A:
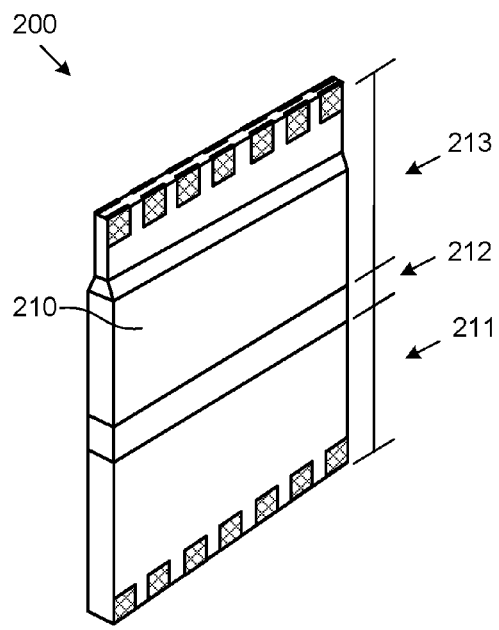
FIG. 6A is a perspective view of a feedthrough electrical connector according to another embodiment.

FIG. 6A is a perspective view of a feedthrough electrical connector 200, according to another embodiment. The feedthrough electrical connector 200 may have a tapered design, thus potentially making the insertion of the outwardly positioned portion 213 into a mating receptacle (not shown) easier. In another embodiment (not shown), sealing portion 212 may be tapered so as to reduce the effective footprint (cross-sectional area) of the connector 200, thus reducing the size of the feedthrough aperture and reducing the likelihood of leakage between the interior cavity 110 and the exterior atmosphere 120 or rendering the sealing process more efficient/effective. In one embodiment, the cross-sectional area of the electrical connector 200, at least at the sealing portion 212, is less than about 200 square millimeters. In another embodiment, the cross-sectional areal of the electrical connector 200 is less than about 100 square millimeters.

Figure 6B:
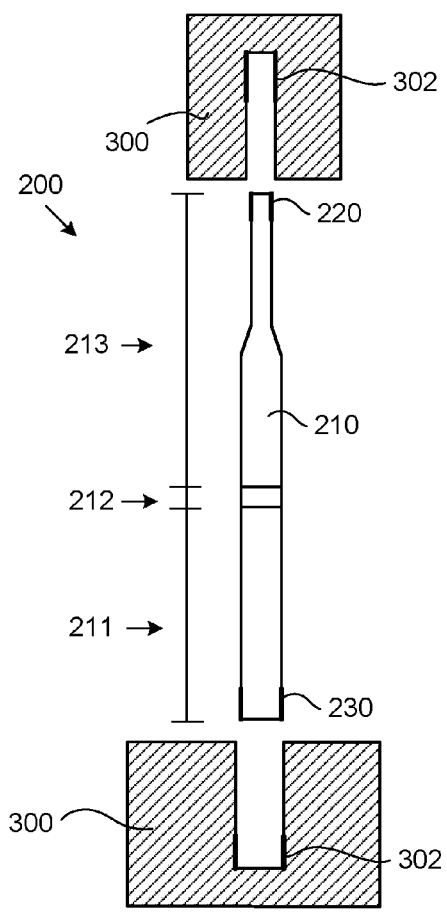
FIG. 6B is a side view of the feedthrough electrical connector of FIG. 6A with corresponding electrical contacts according to one embodiment.

FIG. 6B is a side view of the feedthrough electrical connector 200 of FIG. 6A with corresponding mating receptacles 300, according to one embodiment. The mating receptacles 300 have electrical contact pads 302 that, upon inserting the proper portion of the feedthrough electrical connector 200 into the receptacle, the leads 220, 230 engage the electrical contact pads 302 and an electrical connection is made. The mating receptacles 300 may be electrically coupled to other components. Although not depicted, the mating receptacles 300 and/or the feedthrough electrical connector 200 may have a securing mechanism that fastens the connector in place. The securing mechanism may be a latch, a clamp, a tie, a fastener, a bolt, clasp, pin, clip, etc. In another embodiment, the connector may be held in place merely by the snug fit of the connector 200 within the mating receptacle(s) 300.

As described above, the number, configuration, arrangement, and general dimensions of the leads 220, 230 are not restricted to the embodiments depicted in the Figures. Additionally, it is contemplated that the connector may have shapes other than those depicted and described in the present disclosure. For example, the electrical connector may have a generally racetrack-shaped, ellipse-shaped, or ovular-shaped outer periphery. In other words the outer perimeter of the electrical connector 200, or at least the outer perimeter of one of the portions 211, 212, 213 of the connector 200, may have various shapes. For example, the outer perimeter of the connector 200 may include two opposing sides extending substantially parallel to each other, with the sides being coupled together by semi-circular ends. In another embodiment, the outer perimeter (i.e., footprint) of the connector 200 may have a circular shape. In contrast to traditional feedthrough connectors, the connector 200 may be void of relatively sharp corners or edges.

FIG. 7 is a magnified perspective view of a feedthrough electrical connector 200, according to one embodiment. The electrical connector 200 includes leads 220 disposed on peripheral surfaces of the electrically insulating base 210. As depicted, multiple leads 220 may be spaced apart in multiple directions across the peripheral surfaces of the electrically insulating base 210. For example, the not only can the leads 220 be spaced apart across the width of the connector 200, the leads 220 may be spaced apart down the length of the connector 200. The electrically insulating base 210 may include multiple layers 210a, 210b, 210c, 210d, 210e, 210f formed together. In between adjacent layers, electrical traces 240 can be electrically connected to the leads 220 and extend the length of the connector 200 to connect with corresponding leads/contact points 230 on the opposite end (e.g., between the inwardly positioned portion 211 to the outwardly positioned portion 213). The electrical traces 240 may be constructed from any electrically conductive material that is suited for use in an electrical device. For example, the electrical traces 240 may be constructed of metals such as copper, aluminum, gold, zinc, nickel, brass, bronze, iron, platinum, etc. In another embodiment, the electrical traces 240 may be constructed of other conductive materials, such as graphite and conductive polymers. The number and configuration of the traces 240 and the layers 210a, 210b, 210c, 210d, 210e, 210f is not limited to the depicted embodiment. Depending on the specifics of a given application, many layers 210a, 210b, 210c, 210d, 210e, 210f may be incorporated to properly route the traces 240.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

The present subject matter may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus, comprising:
   a housing defining an interior cavity, the housing comprising a spring aperture;
   a spring coupled to the housing over the spring aperture to at least partially cover the spring aperture, wherein the spring comprises a deflection portion and a feedthrough aperture; and
   an electrical connector comprising an insulated base directly coupled to the spring and extending through the feedthrough aperture and the spring aperture, the insulated base comprising a sealing portion to form a seal with the spring, an outwardly positioned portion partially exterior to the housing, and an inwardly positioned portion partially within the interior cavity of the housing.

2. The apparatus of claim 1, wherein the electrical connector is indirectly coupled to the housing via the spring.

3. The apparatus of claim 1, further comprising at least one support bracket coupled to the housing, wherein the at least one support bracket is in supporting engagement with the electrical connector.

4. The apparatus of claim 3, wherein the electrical connector is indirectly coupled to the housing via the spring and the at least one support bracket.

5. The apparatus of claim 1, wherein the deflection portion of the spring absorbs thermal expansion of one or more of the electrical connector and the housing.

6. The apparatus of claim 1, wherein the deflection portion extends entirely around the feedthrough aperture.

7. The apparatus of claim 1, wherein the deflection portion comprises a rectangular footprint.

8. The apparatus of claim 1, wherein the deflection portion comprises an ovular footprint.

9. The apparatus of claim 1, wherein the spring comprises multiple, spaced-apart deflection portions.

10. The apparatus of claim 1, wherein the spring is directly coupled to an external surface of the housing adjacent the spring aperture.

11. The apparatus of claim 1, wherein the spring is directly coupled to a sidewall of the spring aperture of the housing.

12. The apparatus of claim 1, wherein a first seal between the spring and the housing and a second seal between the spring and the electrical connector maintain the interior cavity as a hermetically sealed environment.

13. The apparatus of claim 12, wherein the interior cavity contains a helium-enriched environment.

14. The apparatus of claim 12, wherein at least one of the first seal and the second seal comprises one or more of solder, adhesive, and epoxy, the epoxy having a low helium permeability.

15. A hard disk drive, comprising:
   a hermetically sealed housing defining and substantially isolating an interior cavity containing a helium enriched environment from an exterior atmosphere, the housing comprising a spring aperture having a first cross-sectional area;
   a spring coupled to the hermetically sealed housing over the spring aperture, wherein the spring comprises a deflection portion and a feedthrough aperture, the feedthrough aperture having a second cross-sectional area smaller than the first cross-sectional area; and an electrical connector comprising an insulated base directly coupled to the spring and extending through the feedthrough aperture and the spring aperture, the insulated base comprising a sealing portion to form a seal with the spring, an outwardly position portion partially exterior to the housing, and an inwardly positioned portion partially within the interior cavity of the housing the electrical connector comprising a plurality of electrical traces extending from a location external to the hermetically sealed housing to a location within the interior cavity of the hermetically sealed housing.

* * * * *